(12) United States Patent
Hargrove et al.

(10) Patent No.: US 7,157,926 B1
(45) Date of Patent: Jan. 2, 2007

(54) UNIVERSAL PADSET CONCEPT FOR HIGH-FREQUENCY PROBING

(75) Inventors: Michael Hargrove, Clinton Corners, NY (US); Michael Starego, Wappinger Falls, NY (US)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/221,327

(22) Filed: Sep. 6, 2005

(51) Int. Cl.
 *G01R 31/26* (2006.01)
(52) U.S. Cl. ............ 324/765; 324/754; 324/158.1
(58) Field of Classification Search ............ None
 See application file for complete search history.

(56) References Cited

U.S. PATENT DOCUMENTS

| | | | | |
|---|---|---|---|---|
| 3,250,851 A | * | 5/1966 | Boening | 174/138 G |
| 3,716,761 A | * | 2/1973 | Rotast | 361/777 |
| 4,489,365 A | * | 12/1984 | Daberkoe | 361/768 |
| 4,684,884 A | | 8/1987 | Soderlund | |
| 4,712,062 A | | 12/1987 | Takamine | |
| 4,858,160 A | | 8/1989 | Strid et al. | |
| 4,994,737 A | | 2/1991 | Carlton et al. | |
| 5,351,001 A | * | 9/1994 | Kornrumpf et al. | 324/158.1 |
| 5,959,845 A | * | 9/1999 | Faucher | 361/777 |
| 6,111,756 A | * | 8/2000 | Moresco | 361/735 |
| 6,480,013 B1 | | 11/2002 | Nayler et al. | |
| 6,822,438 B1 | | 11/2004 | Van Horn et al. | |

* cited by examiner

*Primary Examiner*—Minh N. Tang (57) ABSTRACT

A universal, substrate Padset for de-embedding pad and signal line parasitics has an input pad group including a first input signal pad and a first ground pad; an output pad group including a first output signal pad and a second ground pad; a first input-signal-routing network for routing the first input signal pad to a first input node of a first predetermined test device; a first output-signal-routing network for routing the first output signal pad to a first output node of the first predetermined test device; a second input-signal-routing network for routing the first input signal pad to a second input node of a second predetermined test device; and a second output-signal-routing network for routing the first output signal pad to a second output node of the second predetermined test device. The layout configuration of the first test device is different from the layout configuration of the second test device.

20 Claims, 11 Drawing Sheets

UNIVERSAL PADSET CONCEPT FOR HIGH-FREQUENCY PROBING

BACKGROUND OF THE INVENTION

1. Field of the Invention

The present invention relates to the use of test pad sets and vector network analyzers to de-embed test pad, routing path, and tester probe parasitics from characteristic measurements of a device under test, DUT.

2. Description of the Related Art

Generally, each new integrated circuit (IC) manufacturing process requires that components built with the new IC process be characterized (i.e. their performance tested). This requires that test components (or device under test, DUT, components), along with test pads for accessing the DUTs, be constructed for each new IC process. Characterization test equipment is then used to probe the DUTs by means of test probes applied to the DUTs' access pads. For example, to test the resistance of a resistor of a given material construction and shape, a known voltage may be applied across the resistor's test pads, and the resultant current through it observed. If the resistor's frequency response is desired, then an AC voltage may be applied at the resistor's test pads. However the test pads, signal routing path, and test probes of the characterization test equipment (or device tester) introduce additional loading effects that can alter the DUT's performance.

Therefore, the results observed by the device tester may not accurately reflect the device's true performance. Generally, these effects can be ignored at lower frequencies, but at high frequencies (i.e. above 1 GHz) the effects of the signal pads and tester probes can greatly affect a test device's performance. Under these circumstances, it is important to determine the loading effects of the tester and test pads, in order to calculate out their effect from the DUT's test results. This procedure is typically termed, "to de-embed" the test probe and test pad form the test bed.

To de-embed the loading effects of the testing equipment from a DUT, requires the determination of various electrical vectors. A device typically used to accomplish this task is a vector network analyzer, VNA. Consequently, a vector network analyzer is generally used first to determine the loading effects of the test pads and tester probes on a device. Once the loading effects are known, the device's performance can be tested and the known loading effects can be calculated out (i.e de-embedded) from the test results in order to obtain a true measure of the device's performance. Therefore in high frequency applications, the VNA calibration process needs to be performed prior to testing the performance of any new integrated circuit constructed in a new IC process.

There are several test algorithms for calibrating a VNA (i.e. obtaining the pads', routing path's, and tester probes' loading effects), but most include a short-circuit test and an open-circuit test with the pads and probes connected to a particular DUT (i.e. capacitor, resistor, diode, transistor, etc.). From the short-circuit and open-circuit results, the loading effects of the pads and probes can be determined to generate open-circuit and short-circuit electrical characterization vectors, which are then used to calculate out their loading effects. Since the layout of each DUT, and the routing path of the DUT's input/output nodes to its test pad are different, traditionally one is required to create a separate set of test pads for each type, size, and layout of a DUT, and is required to run the VNA calibration process for each set of test pads and each DUT. Since there may be many different devices of different sizes in any one circuit design, this process can be very time consuming.

Figure 1A:
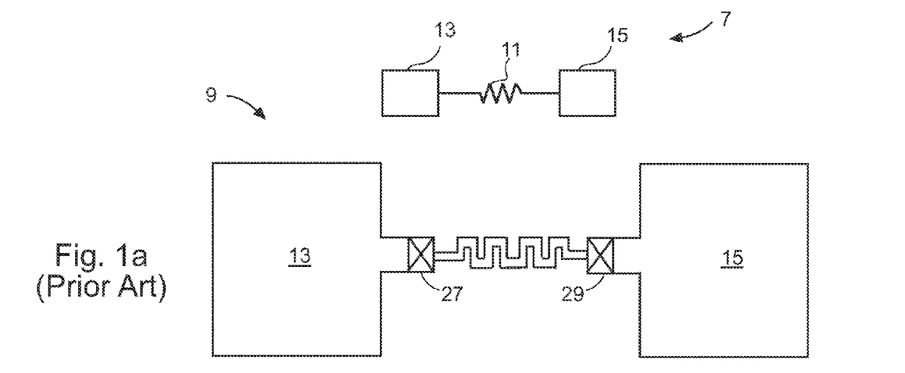
FIG. 1a shows a prior art test pad configuration for obtaining testing (i.e. obtaining the electrical characteristics of) a resistor.

For example, FIG. 1a shows a symbolic representation 7 of a test resistor 11 (i.e. DUT) and test pads 13 and 15 at both its ends, and also shows a representative layout construction 9 of resistor 11 and test pads 13 and 14. It is to be understood that the actual layout structure of resistor 11 would vary depending on the desired resistance value. But this underscores the problem since a separate test DUT would be required for each desired resistor of a given resistance value (i.e of a given size). If test probes were to be applied to pads 13 and 15, the loading effects (i.e. capacitive and resistive components) of pads 13 and 15 along with those of the test probe itself would be added to resistor 11. As a result, the observed test results would likely be inaccurate. The electrical contribution of pads 13 and 15 and of the test probes may be ignored in low frequency applications, but at high frequencies, their effects may greatly affect the frequency response of resistor 11. As explained above, the two most used electrical vector components needed to mathematically calculate out the loading affects of pads 13 and 15 and the test equipment's tester probes are an open circuit test and a short circuit test. As a result, two additional test structure are need to be constructed and measured prior to making any characterizing measurements of resistor 11.

Figure 1B:
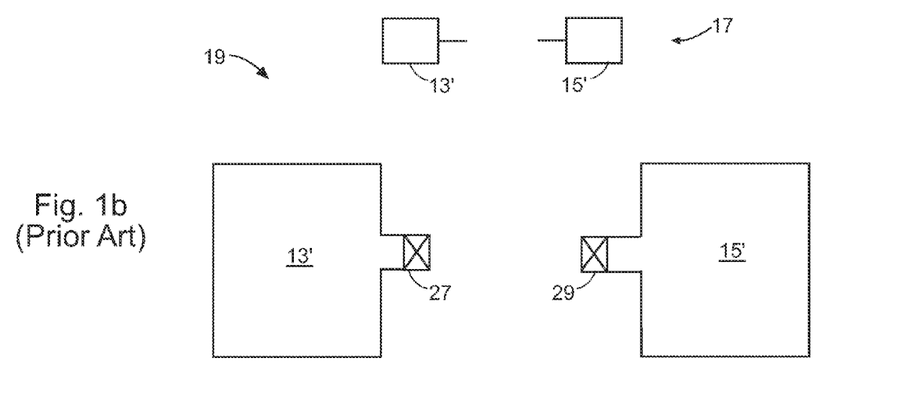
FIGS. 1b and 1c show the test pad configurations for obtaining open-circuit and short-circuit vector characteristics, respectively, of the test pad configuration used in FIG. 1a for purposes of de-embedding pad and signal routing (including probe) parasitics.

With reference to FIG. 1b a symbolic circuit representation 17 and a layout representation 19 of the open circuit structure used to obtain the open circuit vector measurements is shown. It is to be understood that the physical distance between pads 13' and 15', and their physical dimensions are the same as pads 13 and 15 of FIG. 1a. The test probes of a tester, for example a VNA, would then be applied to test pads 13' and 15', and the open circuit test made to obtain its open-circuit, vector characteristic.

Figure 1C:
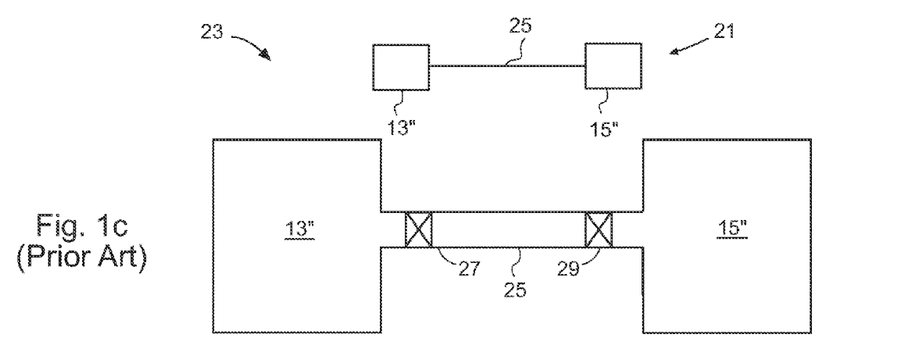

Similarly, FIG. 1c shows a short circuit test structure used to obtain the short circuit measurements needed for the short-circuit vector. Like before, a symbolic circuit representation 21 and a physical layout representation 23 are shown. Also like before, the physical layout and dimensions of pads 13" and 15" are the same as those of pads 13 and 15 of FIG. 1a. In the case of FIG. 1c, however, pads 13" and 15" are shorted together by a conductive path 25. Although coupling symbols 27 and 29 are shown, this is for the sake of completeness, and it is to be understood that if all the pads of FIGS. 1a to 1c are made of metal, and conductive path 25 is also made of metal, then no coupling via, or symbol (27 or 29) is needed. In this case, test pads 13" and 15" and conductive path 25 may form one continuous metal structure. The VNA's probes would then be applied to test pads 13" and 15", and their short circuit performance obtained.

Thus, three separate test pad structures are required to test the specific resistor 11 of FIG. 1a. If one desired to electrically characterize a different resistor, then one would need three different test pad layouts for that different resistor.

Figure 2A:
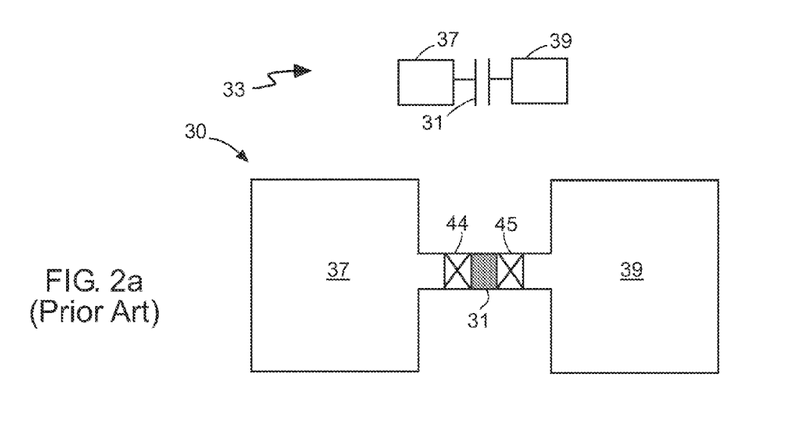
FIG. 2a shows a prior art test pad configuration for obtaining testing (i.e. obtaining the electrical characteristics of) a first capacitor.
Figure 2B:
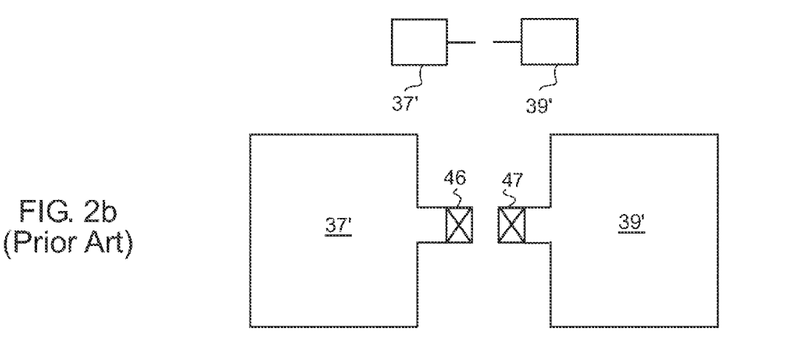
FIGS. 2b and 2c show the test pad configurations for obtaining open-circuit and short-circuit vector characteristics, respectively, of the test pad configuration used in FIG. 2a for purposes of de-embedding pad and signal routing (including probe) parasitics.
Figure 2C:
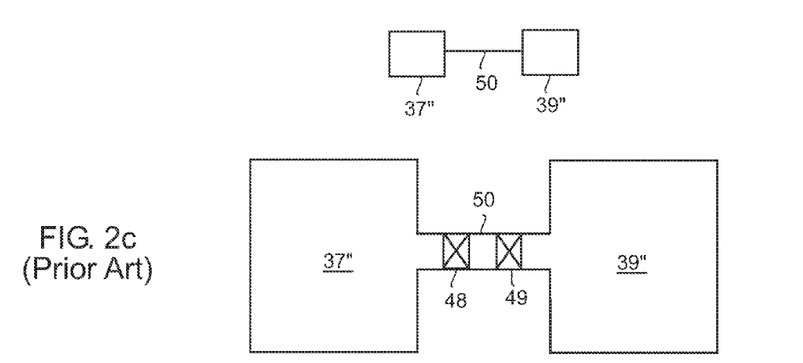
Figure 3A:
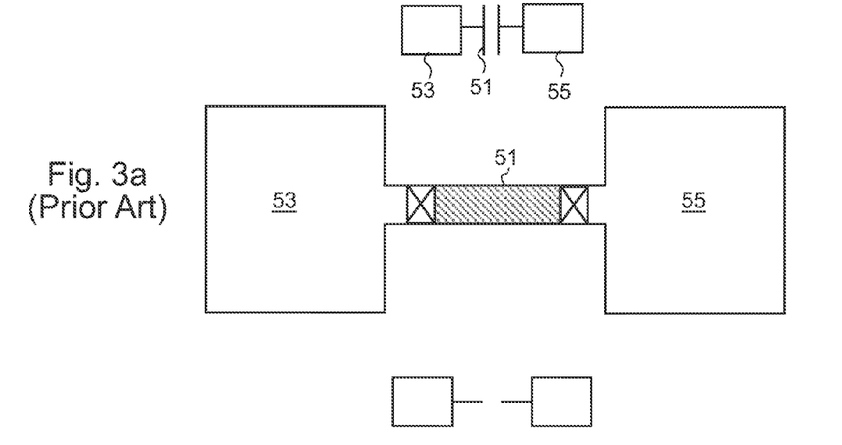
Figure 3B:
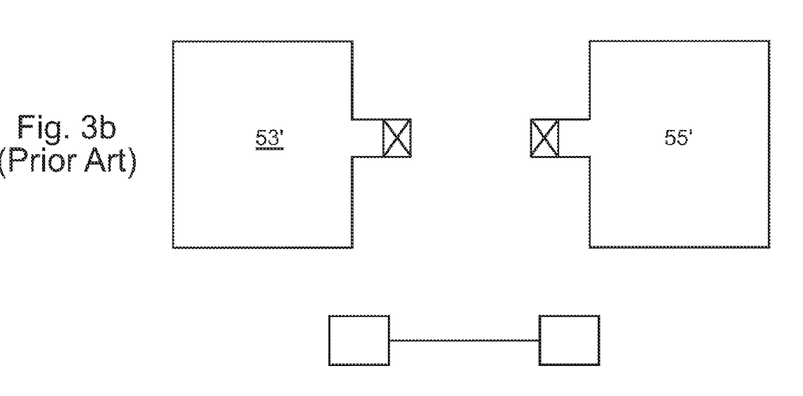
FIGS. 3b and 3c show the test pad configurations for obtaining open-circuit and short-circuit vector characteristics, respectively, of the test pad configuration used in FIG. 3a for purposes of de-embedding pad and signal routing (including probe) parasitics.
Figure 3C:
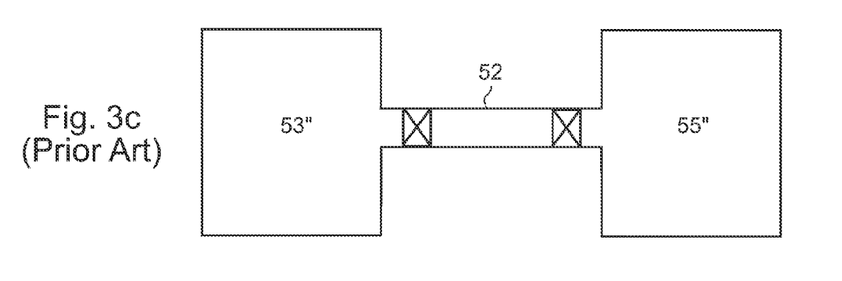

As an example, FIGS. 2a–2c show three different layout configurations needed to electrically characterize a first small capacitor 31, and FIGS. 3a–3c show three additional layout configurations needed to configure a second larger capacitor 51. In FIG. 2a, a symbolic electrical representation 33 and layout representation 30 of pads 37 and 39 coupled to capacitor 31 are shown. Prior to electrically characterizing capacitor 31, short-circuit and open-circuit performance vectors need to be taken in order to properly de-embed the loading effects of test pads 37 and 39 and the tester's probes on capacitor 31. Thus, three separate test layouts and test procedures are needed to properly obtain the electrical characteristics of capacitor 31. The first, is the open-circuit test layout shown in FIG. 2b, and the second is the short-circuit test layout shown in FIG. 2c. Both show symbolic electrical and layout configurations of their respective test pads (37' and 39' in FIG. 2b, and 37" and 39" in FIG. 2c). Like in the previous case of FIGS. 1a–1c, the dimensions and relative displacement of the test pads are the same in FIGS. 2a–2c. Also like before, coupling symbols 46–49 are shown in FIGS. 2b and 2c to maintain symmetry with coupling symbols 44 and 45 in FIG. 2a, but are not critical to the present discussion. In essence, if pads 37" and 39", along with coupling conductive path 50 are all metal, then they may be constructed of a single metal structure.

The point to be made is that if a second capacitor of different size, make-up, or structure needs to be characterized, then a second set of test characterizing pads and open circuit and short circuit test configurations are required, as is shown in FIGS. 3a–3c. In the case of FIG. 3a, testing a second larger capacitor 51 requires that its test pads 53 and 55 be spaced further apart than those of capacitor 31 in FIG. 2a. Therefore, another open-circuit pad layout consisting of pads 53' and 55' are needed, as shown in FIG. 3b, and a second set of short-circuit pads 53" and 55" (having shorting path 52) are needed, as shown in FIG. 3c. Furthermore, the VNA de-embedding procedure must be repeated for test pads 53'/55' and 53"/55" prior to properly testing capacitor 51 using test pads 53 and 55.

Figure 4A:
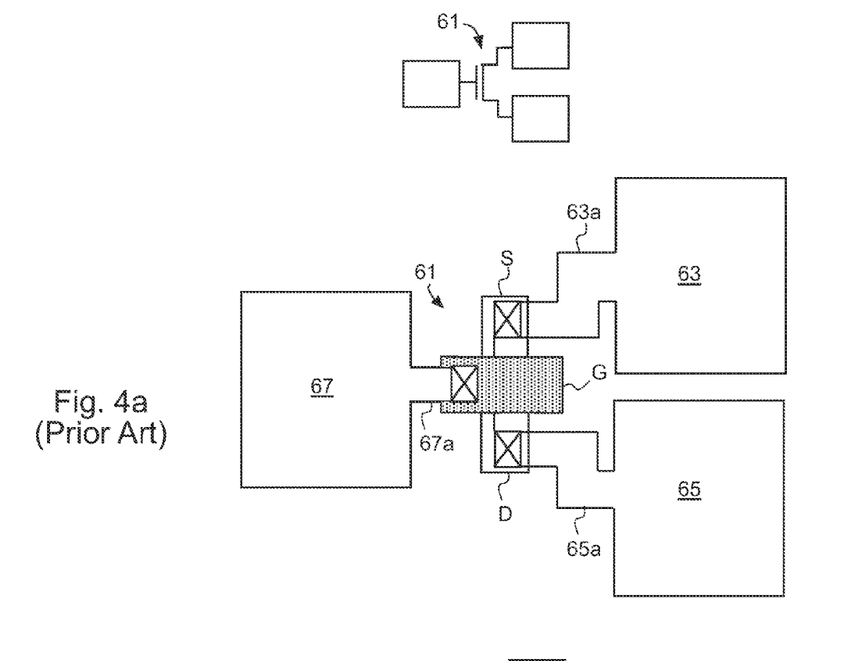
FIG. 4a shows a prior art test pad configuration for obtaining testing (i.e. obtaining the electrical characteristics of) a transistor.
Figure 4B:
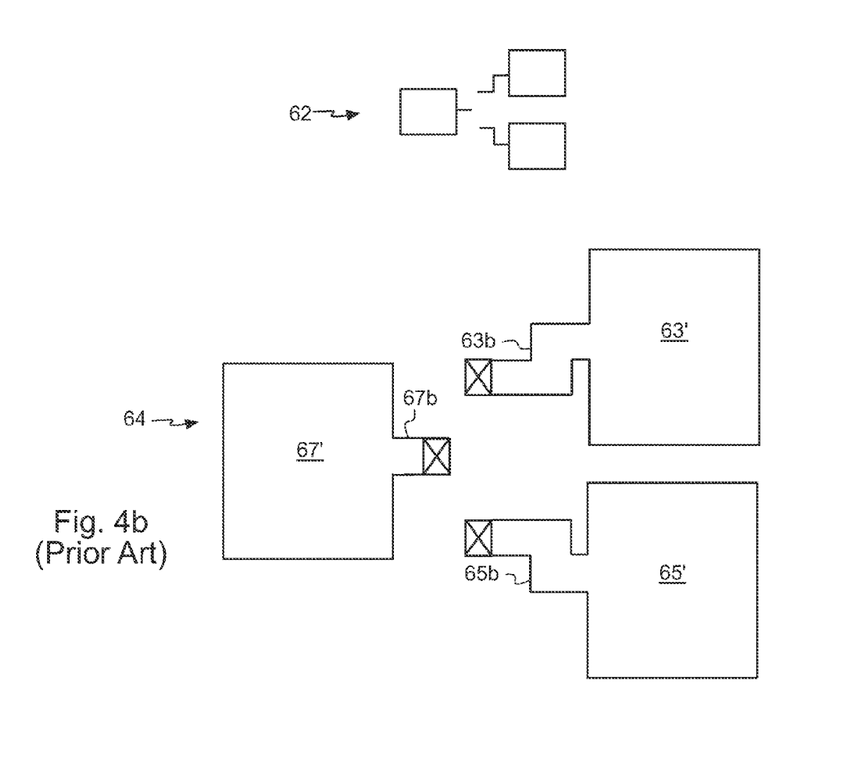
FIGS. 4b and 4c show the test pad configurations for obtaining open-circuit and short-circuit vector characteristics, respectively, of the test pad configuration used in FIG. 4a for purposes of de-embedding pad and signal routing (including probe) parasitics.
Figure 4C:
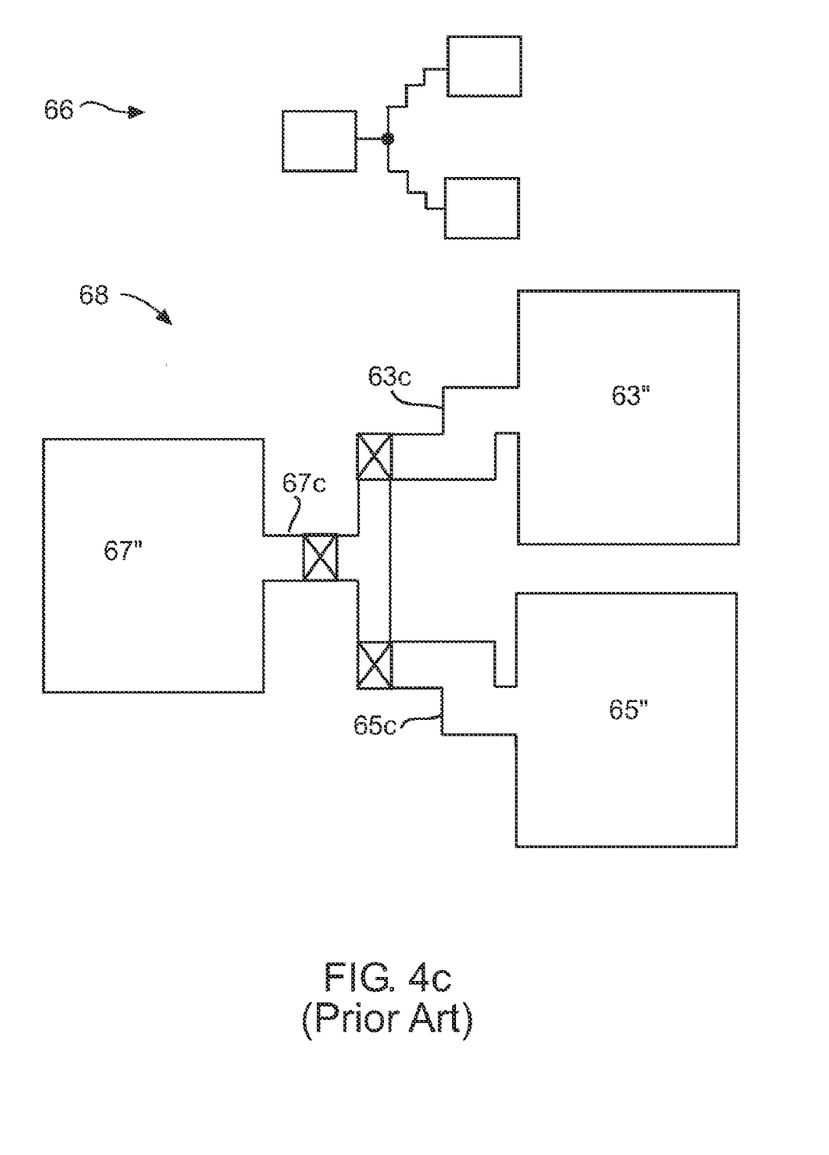

The structures of FIGS. 1a–1c, 2a–2c, and 3a–3c have been for passive devices. For completeness's sake, FIGS. 4a–4c show pad test configurations for an active device, i.e. a transistor 61. As shown in FIG. 4a, transistor 61 includes source electrode S, drain electrode D, and control gate electrode G. The device architecture of a transistor (and that of a capacitor and resistor) are well known in the art, and are not elaborated upon here, for conciseness. However, it is to be understood that control gate G likely consists of an implanted polysilicon layer separated from a substrate bulk (i.e. silicon substrate) by an oxide layer active acting as a gate insulator. It is further to be understood that source and drain regions S and D consist of doped regions within the substrate. It is also to be understood that if transistor 61 is a balanced device, then the source and drain electrodes may be interchanged. The layout configuration of pads 63, 65, and 67 is for illustrative purposes, and any layout configuration properly routed to the transistor's electrodes would be suitable.

In FIG. 4b, the open-circuit, symbolic electrical 62 and layout 64 representations show that the test pads 63', 65', and 67' as well as their corresponding routing paths 63b, 65b, and 67b, maintain the same configuration and relative displacement as test pads 63, 65, and 67 as well as routing paths 63a, 65a, and 67a of FIG. 4a. This is also the case in the short-circuit configuration of FIG. 4c, which also show the symbolic electrical 66 and layout 68 representations. In the present case, the configuration and relative displacement as test pads 63", 65", and 67" and their routing paths 63c, 65c, and 67c to where the input/output nodes of transistor 61 of FIG. 4a would mirror those of pads 63, 65, 67 and routing paths 63a, 65a, 67a of FIG. 4a. As is explained, an VNA would have to first make open-circuit measurements on the structure of FIG. 4b and short-circuit measurements on the structure of FIG. 4c, in order to obtain the needed open-circuit and short-circuit vectors to de-embed itself and the test pads 63, 65, and 67 from the testing of transistor 61.

As is evident from the above, each additional device to be tested, i.e. DUT, requires construction of at least three additional test layout configurations, one to test the DUT and two to obtain the necessary open-circuit and short-circuit electrical vector characteristics for de-embedding the DUT's test pads and the VNA's test probes. Additionally, the VNA's vector calibration sequence must be repeated for each pad-set.

Figure 5A:
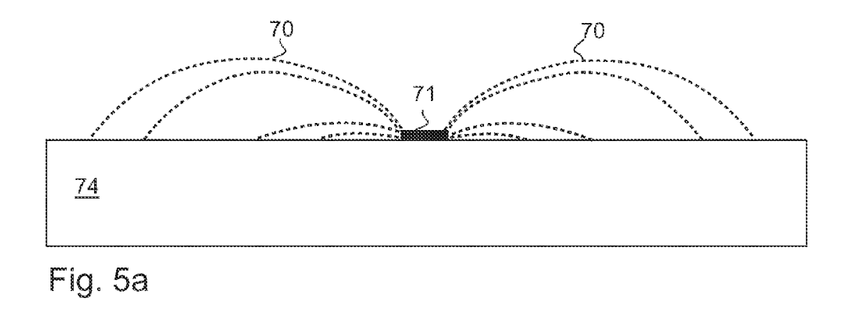
FIG. 5a shows electromagnetic radiation from a signal pad demonstrating parasitic capacitive coupling.
Figure 5B:
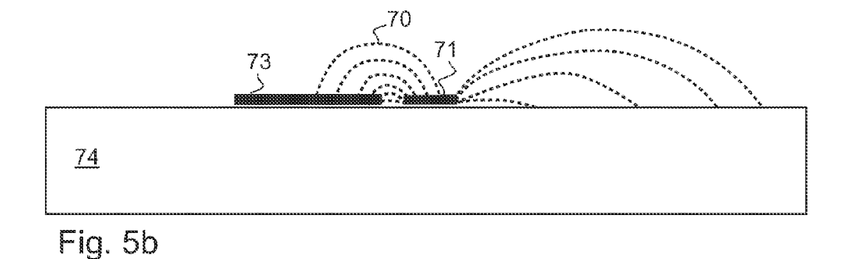
FIG. 5b shows a first ground pad placed on one side of the signal pad of FIG. 5a for reducing capacitive coupling on one side of the signal pad.
Figure 5C:
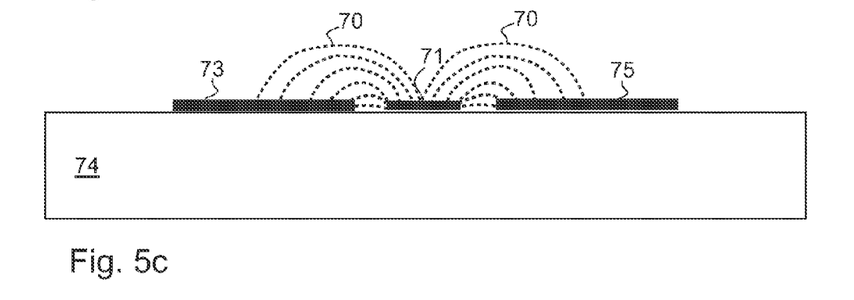
FIG. 5c shows first and second ground pads placed on either side of the signal pad of FIG. 5a for reducing capacitive coupling on both sides of the signal pad, as is suitable for high frequency test applications using a VNA.

With reference to FIG. 5a, another problem associated with testing a DUT is that at high frequencies, electromagnetic radiation 70 will emanate from a signal input or output pad 71. This can result in signal coupling, or capacitive coupling, to the bulk substrate 74 or to adjacent electric elements (i.e. routing paths, other pads, other DUTs, etc), not shown, which would affect the measured test results. One method of reducing the amount of electromagnetic radiation is to ground the radiation prior to it interacting with other elements. In FIG. 5b, this is done by adding a ground pad 73 to capture the electromagnetic radiation 70 radiating from one side of the signal pad 71. However, at high frequencies, this is often not enough, and it is necessary to capture both sides of the electromagnetic radiation 70 radiating from signal pad 71 by adding two ground pads 73 and 75, one at either side of signal pad 71, as is shown in FIG. 5c.

Figure 6:
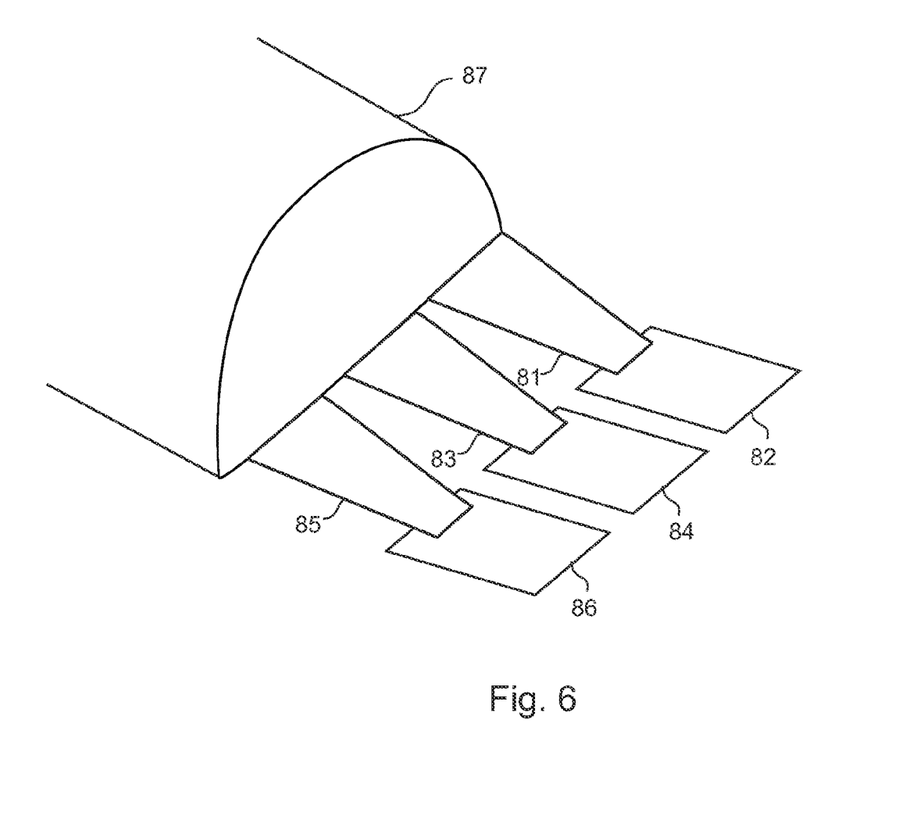
FIG. 6 shows a VNA test probe having three pins, or contact prongs, for suitable for use with the GSG pad configuration of FIG. 5c.

With reference to FIG. 6, a VNA test probe will therefore actually have three contact pins 81, 83, and 85 protruding from a test probe 87. The two output pins 81 and 85 are ground pins, and the center pin 83 is a signal pin. These three pins are positioned to coincide with three test pads 82, 84, and 86 per input signal, or per output signal. The two output test pads, 82 and 86 are ground pads, which surround the center signal pad 84. This is typically known as a ground-signal-ground (or GSG) configuration. Therefore, the test pad configuration actually requires three test pads per input or output signal node of the DUT.

Consequently, the test pad configurations of FIGS. 1a–1c, 2a–2c, 3a–3c, and 4a–4c are actually not suitable for high frequency VNA applications. In addition to the input/output pads shown in theses figures, each signal pad typically requires two additional ground pads, one at either side of the signal pad. This further complicates their construction and increases the size of test pad configuration.

As explained above, the problems of de-embedding test pad and test probe components from an electrical characterization procedure for a DUT is particularly acute in high frequency (commonly referred to as RF) chip designs, which require many different test structures in order to accurately model the various components that comprise the chip. Specifically, for high-frequency (RF) designs many passive elements such as inductors and capacitors are regularly required. These elements are measured using the vector network analyzer (VNA) at frequencies of 20 GHz, or higher. At these high frequencies the ground-signal-ground (GSG) probes, described above, are required to ensure minimal stray capacitance coupling to other nearby structures. These special GSG probes require metal pads that are designed on the chip to exactly match the pitch between the ground and signal pins (i.e. the spacing from the center of pin 81 to 83, and from pin 83 to pin 85) which is typically 150 μm.

In the examples of FIGS. 1a–1c, 2a–2c, and 3a–3c, each DUT has at least two signal lines (i.e. an input node and an output node), which can be thought of as ports for determining the de-embedding electrical vectors. Therefore, at least two sets of GSG pads are needed for each passive element being tested. Depending on the size of the element, the minimum pad set size is at least 300 μm plus the pad dimension in the y-dimension and a suitable spacing in the x-direction that is large enough to fit the test element and necessary routing paths, i.e. wiring.

Figure 7:
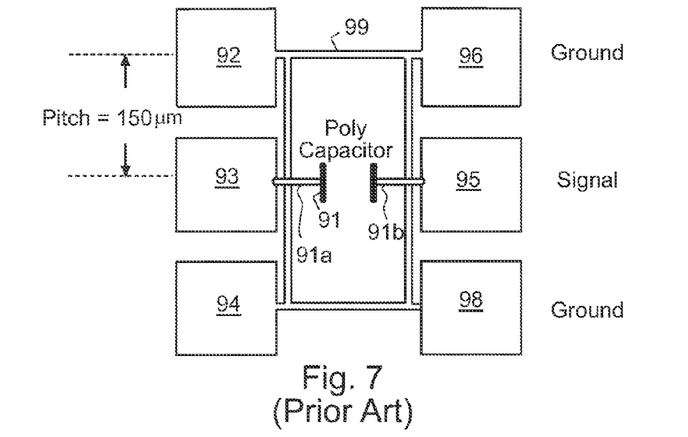
FIG. 7 shows a prior art GSG pad layout configuration for testing a capacitors using an VNA.

An example of a prior art GSG test pad configuration for a polysilicon capacitor is shown in FIG. 7. As shown, although capacitor 91 has two signal pads 93 and 95 for accessing the capacitor's two ends by means of signal routing lines 91a and 91b, four additional ground pads 92, 94, 96 and 98 are needed to use the GSG VNA tester. All four ground pads 92, 94, 96 and 98 are coupled together via routing line 99, but two ground pads are located at either end of each signal pad, 93 and 95. Specifically, ground pads 92 and 94 are placed at either side of signal pad 93, and ground pads 96 and 98 are placed at either end of signal pad 95. As it would be understood, the open-circuit and short circuit pad configurations needed for obtaining the de-embedding open-circuit and short-circuit electrical vectors would also require six pads, and have a configuration similar to that of FIG. 7, with the exception that capacitor 91 would be omitted.

Figure 8:
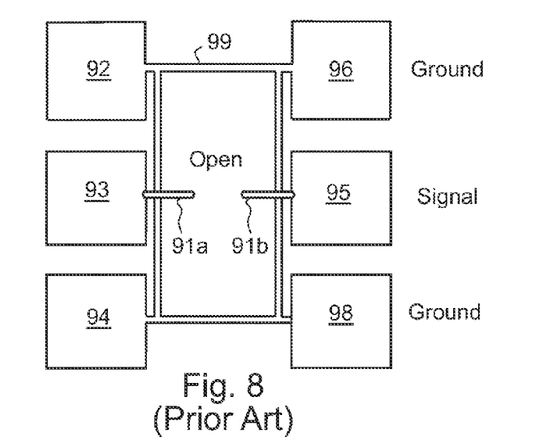
FIGS. 8 and 9 show the open-circuit and short-circuit structures, respectively, of the test pad layout of FIG. 7 for obtaining the open-circuit and short-circuit electric vector characteristics needed to de-embed parasitics from measurements obtain from the structure of FIG. 7.
Figure 9:
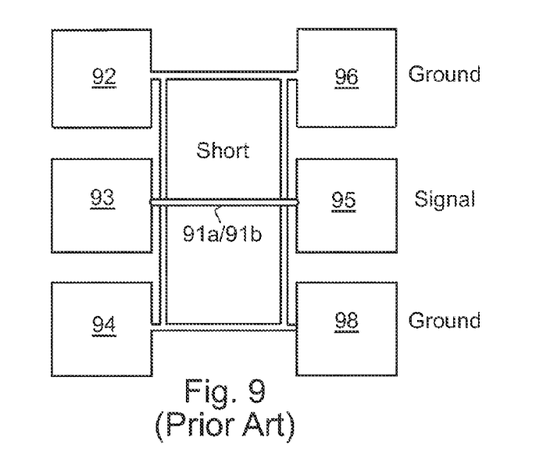

In other words, every device element to be tested requires an open-circuit test and a short-circuit test pad pattern in order to obtain the electrical vectors needed to de-embed the pad, wiring and probe parasitics from the actual device under test (DUT). An example of open-circuit and short-circuit test pad configuration for capacitor 91 of FIG. 7 are shown in FIGS. 8 and 9, respectively. For the sake of brevity, all elements in FIGS. 8 and 9 similar to those of FIG. 7 have the same reference characters, and are described above. In FIG. 8, the ground routing path 99 is isolated from the routing lines 91a and 91b to establish an open-circuit, and in FIG. 9, routing lines 91a and 91b are coupled together to form a short-circuit configuration. Otherwise, the construction of FIGS. 8 and 9 mirrors that of FIG. 7.

The open-circuit and short-circuit test pad patterns must have the exact same pad configuration and wiring pattern as required for the specific DUT. Due to this limitation, every DUT requires its own set of open-circuit and short-circuit test layout with associated pad set, consumes a lot of silicon area on a given test chip.

OBJECTS OF THE INVENTION

It is an object of the present invention to minimize the number of additional test pad sets required for open-circuit and short-circuit test layouts, regardless of how the size of different DUTs vary.

SUMMARY OF THE INVENTION

The present invention seeks to reduce the number of test pad sets and VNA calibrations sequences required to de-embed the loading effects of pads and probes for a large number of test devices, i.e. DUTs. This is accomplished by constructing multiple signal routing patterns suitable for coupling to the input/output nodes of multiple DUTs, but the multiple routing patterns all originate from a pre-set number of test pads sets. Generally, each test pad set includes three pads per test probe, i.e. each probe includes pins for contacting a signal line and two surrounding ground lines in a GSG format. Since the pad locations and the wiring routing pattern from the test pad sets is the same for the multiple test devices, DUTs, the loading effects of each test pad set and test probe is the same for all of the multiple test devices. That is, although the multiple routing patterns are suitable for coupling to multiple types of test devices, only one test pad set needs to be tested in order to determine its open-circuit and short-circuit electrical vectors (i.e. the test pad set and test probe loading effects on each of the multiple test devices, DUTs). Since the test pad, routing, and probe loading effects are the same irrespective of what DUT is appled to them, when a VNA calibration process is implemented on a test device using the multiple routing patterns, the pad and probe loading information obtained is equally applicable to all other test devices to which the routing pattern is suitable. Therefore, only one set of short-circuit and open-circuit vectors need to be obtained for all the suitable DUTs, and thus only two additional open-circuit and short-circuit test pad layout configurations need to be made and tested, as opposed to the prior art, which requires two additional open-circuit and short-circuit test pad layout configurations and two VNA vector calibration sequences for each DUT. Thus, the present invention reduces the number of test pad patterns and VNA calibration sequences needed to characterize a multiple DUTs.

Essentially, the present invention introduces a universal Padset on a substrate for the de-embedding of pad and signal line parasitics comprises: an input pad group including at least a first input signal pad and a first ground pad; an output pad group including at least a first output signal pad and a second ground pad; a first input-signal-routing network having a layout configuration for routing the first input signal pad to a first input node layout location of a first predetermined test device as determined from the layout configuration of the first predetermined test device; a first output-signal-routing network having a layout configuration for routing the first output signal pad to a first output node layout location of the first predetermined test device as determined from the layout configuration of the first predetermined test device; a second input-signal-routing network having a layout configuration for routing the first input signal pad to a second input node layout location of a second predetermined test device as determined from the layout configuration of the second predetermined test device; and a second output-signal-routing network having a layout configuration for routing the first output signal pad to a second output node layout location of the second predetermined test device as determined from the layout configuration of the second predetermined test device. The layout configuration of the first test device is different from the layout configuration of the second test device.

Furthermore, the first input pad and first output pad are coupled to only one of the first or second test devices, and the first and second ground pads are couple to each other by a routing conductive layer. It is further to be understood that the routing conductive layer is one of a metal layer on the substrate, polysilicon layer on the substrate, or diffusion layer in the substrate.

Preferably, the first and second input-signal-routing network share a common signal path from the first input signal pad to a divergent point distant from the first input signal pad, wherein the first and second input-signal-routing networks diverge from the divergent point to respective locations of the first input node layout location and the second input node layout location.

Also, the first and second predetermined test devices are different types of electronic devices. In this case, the first and second predetermined test devices are selected from the following types of electronic devices: resistor, capacitor, inductor, diode, or transistor.

Alternatively, the first and second predetermined test devices are the same types of electronic device, and one of the first and second predetermined test device is larger than the other.

In a preferred embodiment, the input pad group including a third ground pad, and the output pad group including a fourth ground pad. In this case, the first, second, third and fourth ground pads are preferably coupled to each other by an integrated circuit process layer.

In a method for applying the present invention to a first device under test, DUT, the open-circuit and short-circuit electrical vector characteristics of first and second test pad layouts are respectively obtained. The first and second test pad layouts preferably have a configuration suitable for contacting a second DUT having a size different from the first DUT. Then, using the open-circuit and short-circuit electrical vector characteristics in a vector network analyzer, VNA, the pad and routing parasitics are calculate out from test results of the first DUT obtained by the VNA. In accord with the present invention, the first DUT is preferably tested within a third test pad set having a pad and routing configuration substantially similar to the first test pad layout.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts.

FIG. 3a shows a prior art test pad configuration for obtaining testing (i.e. obtaining the electrical characteristics of) a second capacitor larger than the capacitor of FIG. 2a.

DESCRIPTION OF THE PREFERRED EMBODIMENTS

Figure 10:
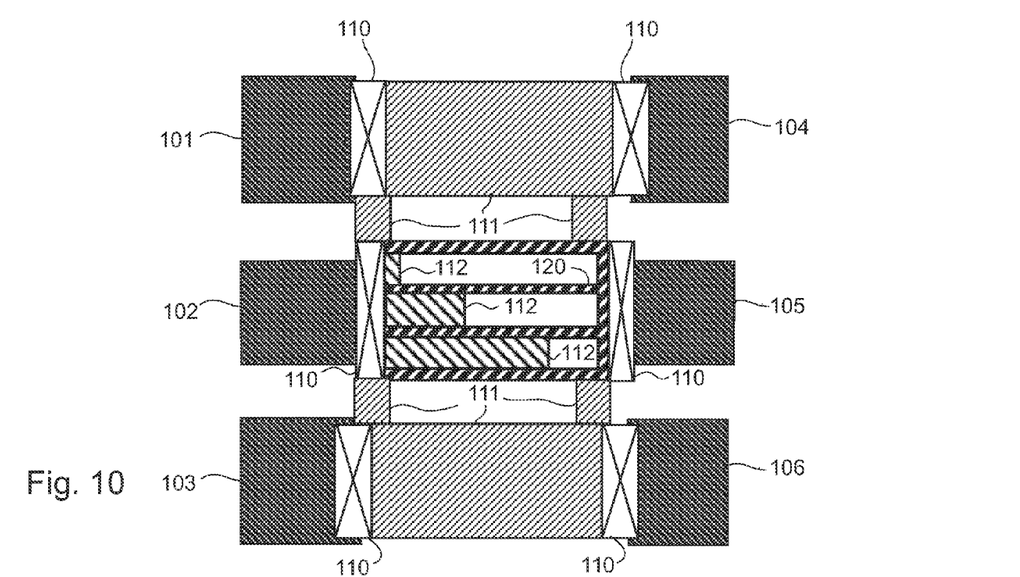
FIG. 10 is an exemplary open-circuit universal pad configuration suitable for the present invention.

With reference to FIG. 10, the present embodiment establishes a universal pad set whose wiring pattern, i.e. routing pattern, to each GSG pad set is such that more than one size, or type, of DUT can be wired to existing GSG pad sets, but only one open-circuit and short-circuit test pad pattern and VNA calibration is required to de-embed the test-bed's parasitics from all the DUTs for which the test GSG pad set is suitable. For example, the test pad configuration of FIG. 10 is shown suitable for multiple sizes of capacitors, or simple resistors (although capacitors will be used in the present exemplary discussion). That is, two GSG pad sets are shown for accessing both end nodes of a capacitor, although no capacitor is shown in FIG. 10. Pads 101–103 constitute a first GSG pad set, and pads 104–106 constitute a second GSG pad set, and together, pads 101–106 constitute one universal pad set. Pads 101, 103, 104, and 106 are ground pads coupled together, and pads 102 and 105 are signal pads isolated from the ground pads. Coupling squares 110 are shown purely for illustrative purposes, and may or may not be needed depending on whether vias are needed to couple a pad to a routing line. For example, it is preferred that pads 101–106 be made on a common metal layer (i.e. they are made of metal), and that ground routing path 111 be constructed on the same metal layer. In this case, ground pads 101, 103, 104, and 106 and ground routing path 111 may be constructed of the same metal layer in a single structure, and no vias are needed. In this case, metal ground routing line 111 would reside on a process layer above signal routing path 112. Thus, signal routing path 112 would be coupled to signal pad 102 by means of a via. Alternatively, signal routing path 112 might be made of metal, in which case no via is needed to couple signal routing path 112 to signal pad 102, but this would require that the ground routing line that cross signal path 112 be constructed of a different conductive layer (perhaps a lower metal layer or a conductive polysilicon layer), and vias would be needed for coupling the upper layer part of the ground routing path to the lower layer part of the ground routing path. However, it is believed that the requirements and limitations of routing conductive paths in integrated circuits are well understood in the art, and will therefore not be elaborated upon any further herein.

The point to be made in FIG. 10 is that signal routing path pad 112 (which may constitute an input routing path) forks from signal pad 102 (which may constitute an input signal pad) in three different directions to three different contact points (i.e. end points) on the substrate. An optional insulation layer 120 separate the forks in routing path 112. Basically, each of the forks of signal routing path 112 is of different length suitable for contacting a different capacitor of different length.

Similarly, signal pad 105 (which may constitute an output pad) is coupled to a second signal routing path, not shown in the layout view of FIG. 10 that similarly forks to preferably face the endpoints of the three forks of input routing path 112. It is to be understood that since the present pad set is illustratively to be used with a capacitor, the output routing path extending from (output) signal pad 105 is likely a diffusion layer within the silicon substrate on which the pad set resides. In this case, a via(s) would likely be needed to couple signal pad 105 to its signal routing path. As it is known in the art, the upper plate of an integrated capacitor is typically made of a polysilicon layer, and the lower plate of an integrate capacitor is typically made of a diffusion layer in the substrate. The structures of integrated capacitors, resistors, inductors, etc. are well known, and are not elaborated upon herein.

The point is that all forks of input routing path 112 (each of which is designed to couple to an input node of a different size (or type) DUT) are coupled to a single input signal pad, 102. Also, output signal pad 105 is coupled to an output routing path that also forks and has a layout configuration suitable for coupling the output nodes of the different size (or type) DUTs. At this point a VNA may be used to determine the open-circuit vector characteristics of the test pad set configuration of FIG. 10.

Figure 11:
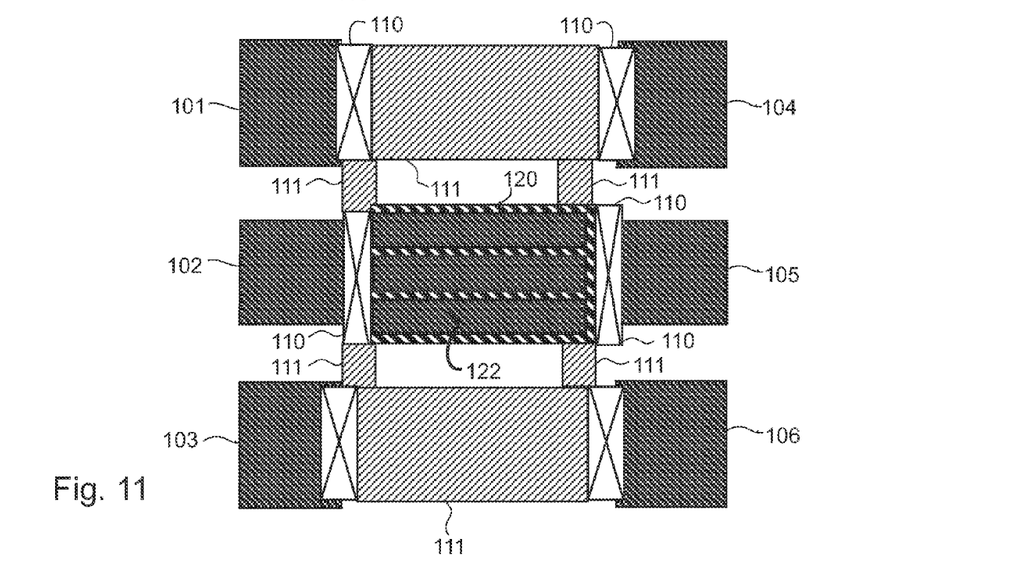
FIG. 11 is an exemplary short-circuit universal pad configuration suitable for the present invention.

The short circuit layout of the presently exemplary test pad layout is shown in FIG. 11. For the sake of brevity, all elements in FIGS. 11–14 similar to those of FIG. 10 have similar reference number, and are described above. It is to be understood, however, that the test pad configuration of FIG. 11 is a second pad set in addition to the test pad set of FIG. 10. In FIG. 11, input pad 102 is shorted to output pad 105. Several methods exist for achieving this. For example, input routing path 112 of FIG. 10 may be extended to couple to output pad 105. Alternatively, as shown in FIG. 11, the metal layer of input pad 102 may be extended to form a coupling metal path 122 coupled to output pad 105. In this case, no vias would be needed for signal pads 102 and 105. At this point VNA equipment may be used to obtain the short-circuit electrical vectors characteristics needed to de-embed the test bed's parasitics from a DUT.

As stated above, more than one size DUT is able to be contacted in the area (i.e. channels) between the input (101–103) and output (104–106) GSG pads. Since all of the metal wiring is connected to the DUT (irrespective of whether some routing paths lead ends that are not coupled to the DUT), no matter what the size of the DUT, the open-circuit and short-circuit structures of FIGS. 10 and 11 also contain the same metal wiring paths which enables the accurate de-embedding of the more than one DUT and the associated parasitics. That is, the same open-circuit and short-circuit de-embedding vectors obtained from the structures of FIGS. 10 and 11 may be used with any DUT that is suited for (i.e. fits) the openings shown in FIG. 10.

Figure 12:
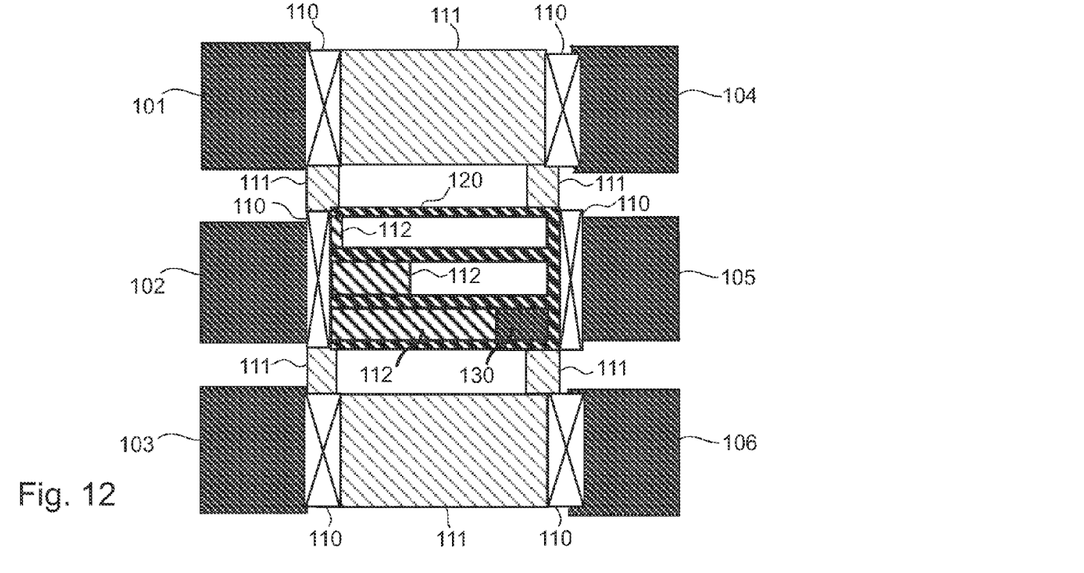
FIG. 12 is an exemplary use of the universal Padset of the present invention used to obtain the electrical vector characteristics of a first small capacitor constructed within the lower channel opening of the universal Padset.

For example in FIG. 12, a first capacitor 130 having a relatively small size may be constructed within the lower channel of the test pad structure of FIGS. 10 and 11, and its test-bed's parasitics may be directly calculated out using the open-circuit and short-circuit results obtained from the structures of FIGS. 10 and 11. There is no need to construct another specially laid out, and sized, test pad set or to re-determined a new set of open-circuit and short-circuit electrical vectors since the parasitics for the test pad structure of FIG. 12 are the same as those obtained from the structures of FIGS. 10 and 11.

Figure 13:
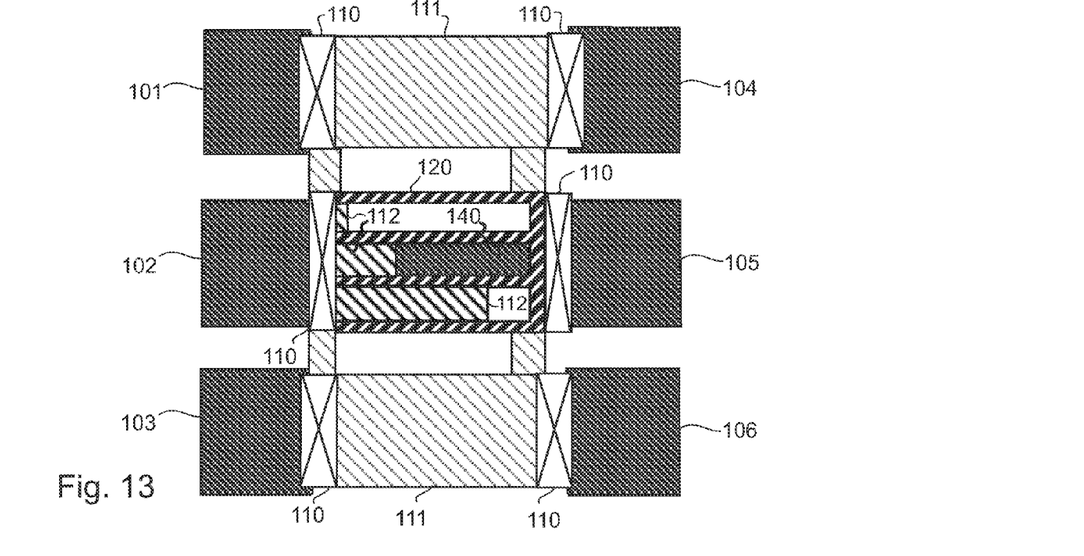
FIG. 13 is an exemplary use of the universal Padset of the present invention used to obtain the electrical vector characteristics of a second bigger capacitor constructed within the central channel opening of the universal Padset.

Similarly in FIG. 13, the test pad structure of FIGS. 10 and 11 are used to test (i.e. electrically characterize the behavior of) a second capacitor 140, larger than capacitor 130, and laid within the central channel between signal pads 102 and 105. Like in the case of FIG. 12, there is no need to construct another specially laid out, and sized, test pad set or to re-determined a new set of open-circuit and short-circuit electrical vectors since the parasitics for the test pad structure of FIG. 13 are the same as those obtained from the structures of FIGS. 10 and 11.

Figure 14:
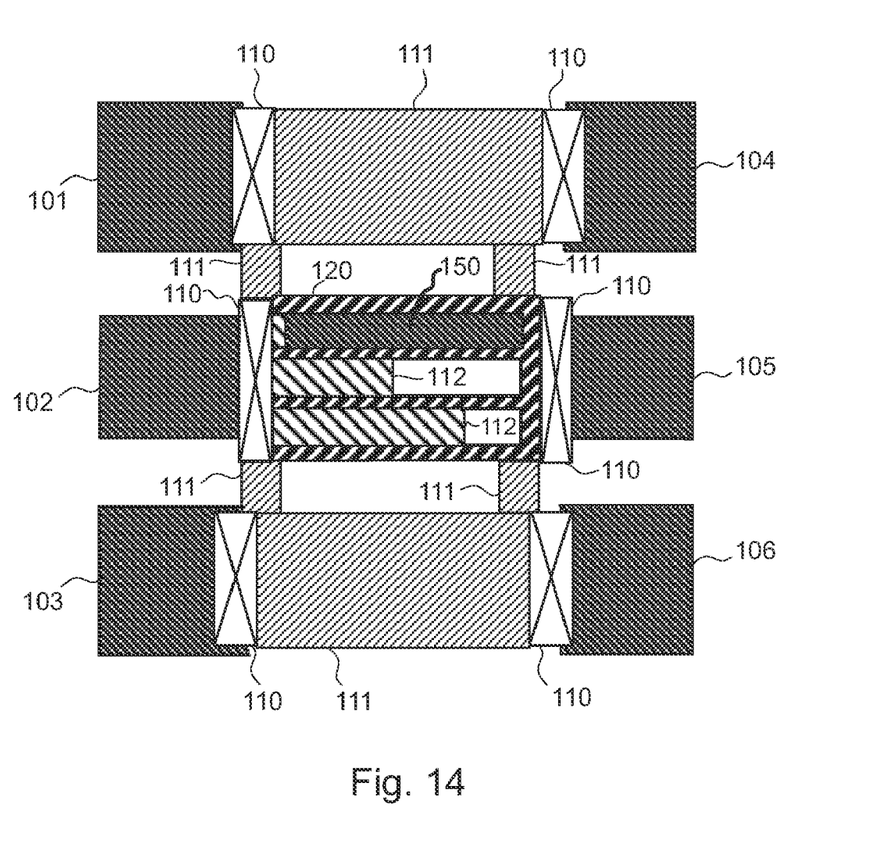
FIG. 14 is an exemplary use of the universal Padset of the present invention used to obtain the electrical vector characteristics of a third still bigger capacitor constructed within the upper channel opening of the universal Padset.

In FIG. 14, the test pad structure of FIGS. 10 and 11 are used to test (i.e. electrically characterize the behavior of) a third capacitor 150, larger than capacitors 130 and 140, and laid within the upper channel between signal pads 102 and 104. Like in the case of FIGS. 12 and 13, there is no need to construct another specially laid out, and sized, test pad set or to re-determined a new set of open-circuit and short-circuit electrical vectors since the parasitics for the test pad structure of FIG. 14 are the same as those obtained from the structures of FIGS. 10 and 11.

Although the above description of the preferred embodiment is described as applied to capacitors of different sizes, it is to be understood that the present test pad structure (and testing method) may be applied to different types of devices including resistors, inductors, diodes, transistors, etc. Additionally, it is to be understood that the universal Padset of FIGS. 12 and 13 can be applied to still larger capacitors by constructing multiple capacitors within multiple channel openings, one coupled to a different prong of the forked input path and corresponding prong of the output fork.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A universal Padset on a substrate for the de-embedding of pad and signal line parasitics, comprising:
   an input pad group including at least a first input signal pad and a first ground pad;
   an output pad group including at least a first output signal pad and a second ground pad;
   a first input-signal-routing network having a layout configuration for routing said first input signal pad to a first input node layout location of a first predetermined test device as determined from the layout configuration of said first predetermined test device;
   a first output-signal-routing network having a layout configuration for routing said first output signal pad to a first output node layout location of said first predetermined test device as determined from the layout configuration of said first predetermined test device;

a second input-signal-routing network having a layout configuration for routing said first input signal pad to a second input node layout location of a second predetermined test device as determined from the layout configuration of said second predetermined test device; and a second output-signal-routing network having a layout configuration for routing said first output signal pad to a second output node layout location of said second predetermined test device as determined from the layout configuration of said second predetermined test device;

wherein the layout configuration of said first test device is different from the layout configuration of said second test device.

2. The universal Padset of claim 1, wherein said first input pad and first output pad are coupled to only one of said first or second test devices.

3. The universal Padset of claim 1, wherein said first and second ground pads are couple to each other by a routing conductive layer.

4. The universal Padset of claim 3, wherein said routing conductive layer is one of a metal layer on the substrate, polysilicon layer on the substrate, or diffusion layer in the substrate.

5. The universal Padset of claim 1, wherein said first and second input-signal-routing network share a common signal path from said first input signal pad to a divergent point distant from said first input signal pad, wherein said first and second input-signal-routing networks diverge from said divergent point to respective locations of said first input node layout location and said second input node layout location.

6. The universal Padset of claim 1, wherein said first and second predetermined test devices are different types of electronic devices.

7. The universal Padset of claim 6, wherein said first and second predetermined test devices are selected from the following types of electronic devices: resistor, capacitor, inductor, diode, or transistor.

8. The universal Padset of claim 1, wherein said first and second predetermined test devices are the same types of electronic device, and one of said first and second predetermined test device is larger than the other.

9. The universal Padset of claim 1, wherein:
said input pad group including a third ground pad; and
said output pad group including a fourth ground pad.

10. The universal Padset of claim 9, wherein said first, second, third and fourth ground pads are coupled to each other by an integrated circuit process layer.

11. A method for de-embedding pad and routing parasitics from a first device under test, DUT, comprising:
obtaining open-circuit and short-circuit electrical vector characteristics of first and second test pad layouts, respectively, said first and second test pad layouts having a configuration suitable for contacting a second DUT having a size different from said first DUT;
using said open-circuit and short-circuit electrical vector characteristics in a vector network analyzer, VNA, to calculate out said pad and routing parasitics from test results of said first DUT obtained by said VNA.

12. The method of claim 11, wherein said first DUT is tested within a third test pad set having a pad and routing configuration substantially similar to said first test pad layout.

13. A method for de-embedding pad and routing parasitics from a first device under test, DUT, comprising:
obtaining open-circuit and short-circuit electrical vector characteristics of first and second test pad layouts, respectively, said first and second test pad layouts having a configuration suitable for contacting a second DUT having a size different from said first DUT;
using said open-circuit and short-circuit electrical characteristics in a vector network analyzer, VNA, to calculate out said pad and routing parasitics from test results of said first DUT obtained by said VNA;
wherein said first DUT is tested within a third test pad set having a pad and routing configuration substantially similar to said first test pad layout;
wherein said third test pad set is a universal Padset on a substrate, and the universal Padset further comprises:
an input pad group including at least a first input signal pad and a first ground pad;
an output pad group including at least a first output signal pad and a second ground pad;
a first input-signal-routing network having a layout configuration for routing said first input signal pad to a first input node layout location of a first predetermined test device as determined from the layout configuration of said first predetermined test device;
a first output-signal-routing network having a layout configuration for routing said first output signal pad to a first output node layout location of said first predetermined test device as determined from the layout configuration of said first predetermined test device;
a second input-signal-routing network having a layout configuration for routing said first input signal pad to a second input node layout location of a second predetermined test device as determined from the layout configuration of said second predetermined test device; and
a second output-signal-routing network having a layout configuration for routing said first output signal pad to a second output node layout location of said second predetermined test device as determined from the layout configuration of said second predetermined test device;
wherein the layout configuration of said first test device is different from the layout configuration of said second test device.

14. The method of claim 13, wherein said first input pad and first output pad are coupled to only one of said first or second test devices.

15. The method of claim 13, wherein said first and second ground pads are couple to each other by a routing conductive layer.

16. The method of claim 15, wherein said routing conductive layer is one of a metal layer on the substrate, polysilicon layer on the substrate, or diffusion layer in the substrate.

17. The method of claim 13, wherein said first and second input-signal-routing network share a common signal path from said first input signal pad to a divergent point distant from said first input signal pad, wherein said first and second input-signal-routing networks diverge from said divergent point to respective locations of said first input node layout location and said second input node layout location.

18. The method of claim 13, wherein said first and second predetermined test devices are different types of electronic devices.

19. The method of claim 13, wherein said first and second predetermined test devices are the same types of electronic device, and one of said first and second predetermined test device is larger than the other.

20. The method of claim 13, wherein:
said input pad group includes a third ground pad;
said output pad group including a fourth ground pad; and
said first, second, third and fourth ground pads are coupled to each other by an integrated circuit process layer.

* * * * *